(12) United States Patent
Mitsunaga et al.

(10) Patent No.: US 10,325,801 B2
(45) Date of Patent: Jun. 18, 2019

(54) MOUNTING TABLE SYSTEM, SUBSTRATE PROCESSING APPARATUS, AND TEMPERATURE CONTROL METHOD

(71) Applicant: TOKYO ELECTRON LIMITED, Tokyo (JP)

(72) Inventors: Tadashi Mitsunaga, Nirasaki (JP); Tetsuya Miyashita, Nirasaki (JP); Tatsuo Hatano, Nirasaki (JP); Naoki Watanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/594,699

(22) Filed: May 15, 2017

(65) Prior Publication Data

US 2017/0330787 A1   Nov. 16, 2017

(30) Foreign Application Priority Data

May 16, 2016 (JP) ................................. 2016-097778

(51) Int. Cl.
| | |
|---|---|
| C23C 14/35 | (2006.01) |
| C23C 14/50 | (2006.01) |
| C23C 14/54 | (2006.01) |
| H01L 21/67 | (2006.01) |
| C23C 16/458 | (2006.01) |
| H01L 21/687 | (2006.01) |

(52) U.S. Cl.
CPC ........ *H01L 21/68714* (2013.01); *C23C 14/35* (2013.01); *C23C 14/505* (2013.01); *C23C 14/541* (2013.01); *C23C 16/4584* (2013.01); *H01L 21/67103* (2013.01); *H01L 21/67109* (2013.01); *H01L 21/67248* (2013.01)

(58) Field of Classification Search
CPC ..... C23C 14/35; C23C 14/505; C23C 14/541; C23C 16/4584; H01L 21/68714; H01L 21/67103; H01L 21/67109; H01L 21/67248; H01L 21/6714; H01L 22/12; H01L 23/34; H01L 2021/60
USPC ...................................... 269/287, 289, 289 R
See application file for complete search history.

(56) References Cited

U.S. PATENT DOCUMENTS

| | | | |
|---|---|---|---|
| 5,630,881 A * | 5/1997 | Ogure ................. | C23C 16/4584 118/725 |
| 8,803,039 B2 * | 8/2014 | Sato ...................... | F24H 9/2014 219/439 |

(Continued)

FOREIGN PATENT DOCUMENTS

JP        10-189692 A       7/1998

*Primary Examiner* — Joseph J Hail
*Assistant Examiner* — Timothy Brian Brady
(74) *Attorney, Agent, or Firm* — Nath, Goldberg & Meyer; Jerald L. Meyer

(57) ABSTRACT

There is provided a mounting table system which includes: a mounting table rotatably installed so as to mount a substrate thereon; a plurality of heating parts installed in the mounting table, and configured to heat the mounting table; a single power source configured to supply an electric power to the plurality of heating parts; and a power switching part configured to switch from a first heating part among the plurality of heating parts to which the electric power is supplied from the single power source, to a second heating part among the plurality of heating parts, depending on a rotational angle of the mounting table.

15 Claims, 9 Drawing Sheets

(56) References Cited

U.S. PATENT DOCUMENTS

| | | | |
|---|---|---|---|
| 2003/0062359 A1* | 4/2003 | Ho | H01L 21/67103 219/444.1 |
| 2004/0052963 A1* | 3/2004 | Ivanov | C23C 18/1619 427/443.1 |
| 2015/0226611 A1* | 8/2015 | Busche | H01L 21/6833 374/121 |

* cited by examiner

FIG. 3

| Power ratio | $P_{Z1}/P_{Z1}$ | $P_{Z2}/P_{Z1}$ | $P_{Z3}/P_{Z1}$ | $P_{Z4}/P_{Z1}$ |
|---|---|---|---|---|
| High temperature | 1.00 | 1.20 | 0.80 | 0.60 |
| Medium temperature | 1.00 | 1.10 | 0.90 | 0.80 |
| Low temperature | 1.00 | 1.05 | 0.95 | 0.90 |

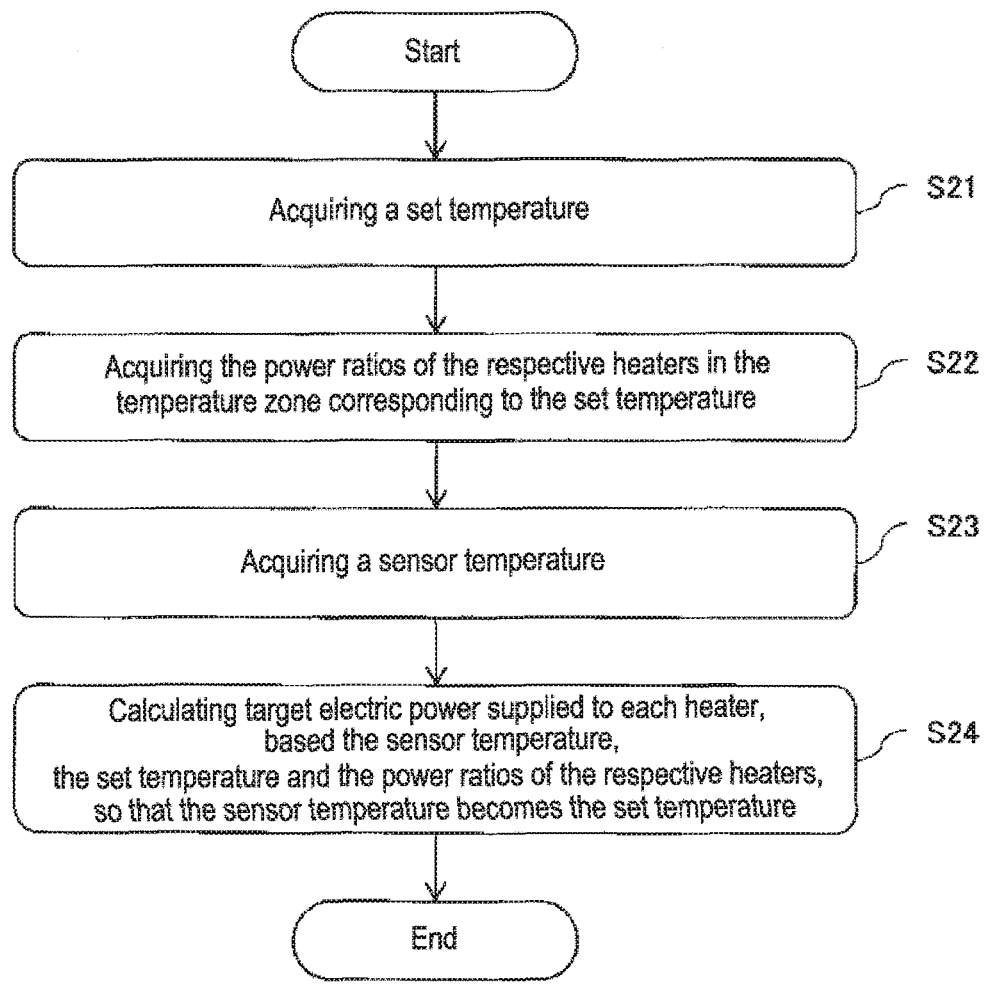

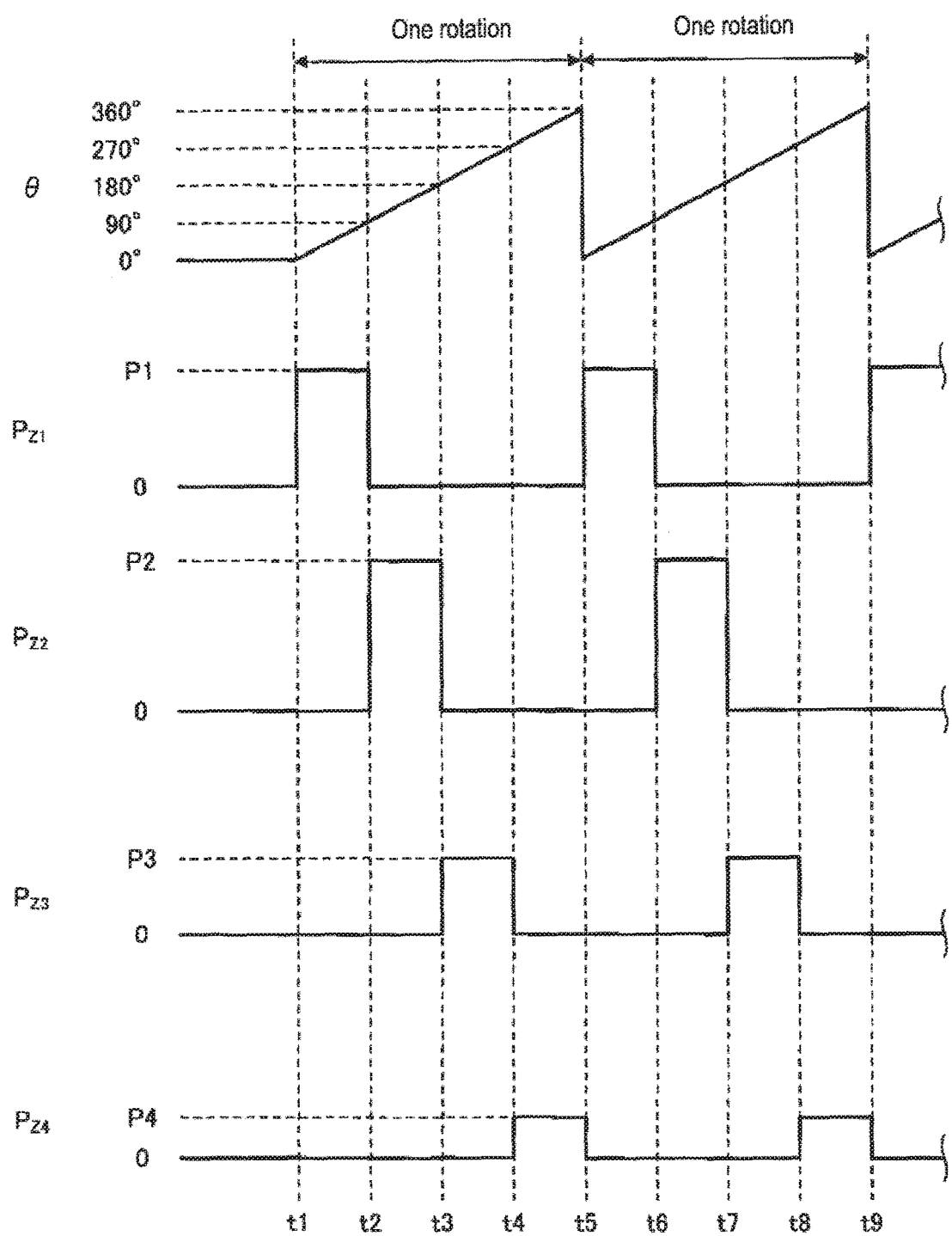

MOUNTING TABLE SYSTEM, SUBSTRATE PROCESSING APPARATUS, AND TEMPERATURE CONTROL METHOD

CROSS-REFERENCE TO RELATED APPLICATION

This application claims the benefit of Japanese Patent Application No. 2016-097778, filed on May 16, 2016, in the Japan Patent Office, the disclosure of which is incorporated herein in its entirety by reference.

TECHNICAL FIELD

The present disclosure relates to a mounting table system, a substrate processing apparatus, and a temperature control method.

BACKGROUND

There is known a substrate processing apparatus that places a substrate on a mounting table installed in a vacuum container, heats the substrate, and performs processes such as a film formation process, an etching process and the like on the substrate in a state in which the mounting table is rotated. In such a substrate processing apparatus, it is important to adjust the in-plane temperature distribution of the substrate because the in-plane temperature distribution of the substrate placed on the mounting table affects a deposition rate, an etching rate and the like.

The in-plane temperature distribution of the substrate is adjusted, for example, by installing a plurality of heating parts inside the mounting table and independently controlling the electric power to be supplied to the plurality of heating parts. The electric power is supplied from power sources installed in a corresponding relationship with the respective heating parts to the plurality of heating parts.

However, in a mounting table system in which the power sources are installed for a plurality of heating parts and in which the in-plane temperature distribution of a substrate is adjusted by supplying the electric power from the respective power sources to the respective heating parts, it is required to have the number of power sources to be the same as the number of heating parts. This poses a problem in that the system becomes larger in size.

SUMMARY

Some embodiments of the present disclosure provide a mounting table system capable of performing temperature control of a plurality of heating parts in a space saving manner.

According to one embodiment of the present disclosure, there is provided a mounting table system which includes: a mounting table rotatably installed so as to mount a substrate thereon; a plurality of heating parts installed in the mounting table, and configured to heat the mounting table; a single power source configured to supply an electric power to the plurality of heating parts; and a power switching part configured to switch from a first heating part among the plurality of heating parts to which the electric power is supplied from the single power source, to a second heating part among the plurality of heating parts, depending on a rotational angle of the mounting table.

According to another embodiment of the present disclosure, there is provided a substrate processing apparatus which includes: the aforementioned mounting table system; and a control part configured to control the electric power supplied to each of the plurality of heating parts, wherein the mounting table system further includes a temperature detecting part configured to detect a temperature of the mounting table, and the control part is configured to control the electric power supplied to each of the plurality of heating parts based on a temperature detected by the temperature detecting part and a set temperature.

According to yet another embodiment of the present disclosure, there is provided a temperature control method which makes use of a mounting table system including a mounting table rotatably installed so as to mount a substrate thereon, a plurality of heating parts installed in the mounting table and configured to heat the mounting table, a single power source configured to supply an electric power to the plurality of heating parts, and a power switching part configured to switch from a first heating part among the plurality of heating part to which the electric power is supplied from the single power source, to a second heating part among the plurality of heating parts depending on a rotational angle of the mounting table. The method includes controlling the electric power supplied to the plurality of heating parts in synchronization with a timing at which the plurality of heating part supplied with e electric power from the single power source is switched.

According to still another embodiment of the present disclosure, there is provided a mounting table system which includes: a mounting table rotatably installed so as to mount a substrate thereon; a plurality of heating parts installed in the mounting table and configured to heat the mounting table; and a power switching part configured to switch from a first heating part among the plurality of heating part to which an electric power is supplied from a single power source, to a second heating part among the plurality of heating parts, depending on a rotational angle of the mounting table.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a table showing the ship between power ratios of respective heaters for each temperature zone.

FIG. 9 is a flowchart showing a method of calculating the electric power to be supplied to heaters.

FIG. 10 is a tuning chart showing a temperature control method according to one embodiment.

DETAILED DESCRIPTION

Figure 1:
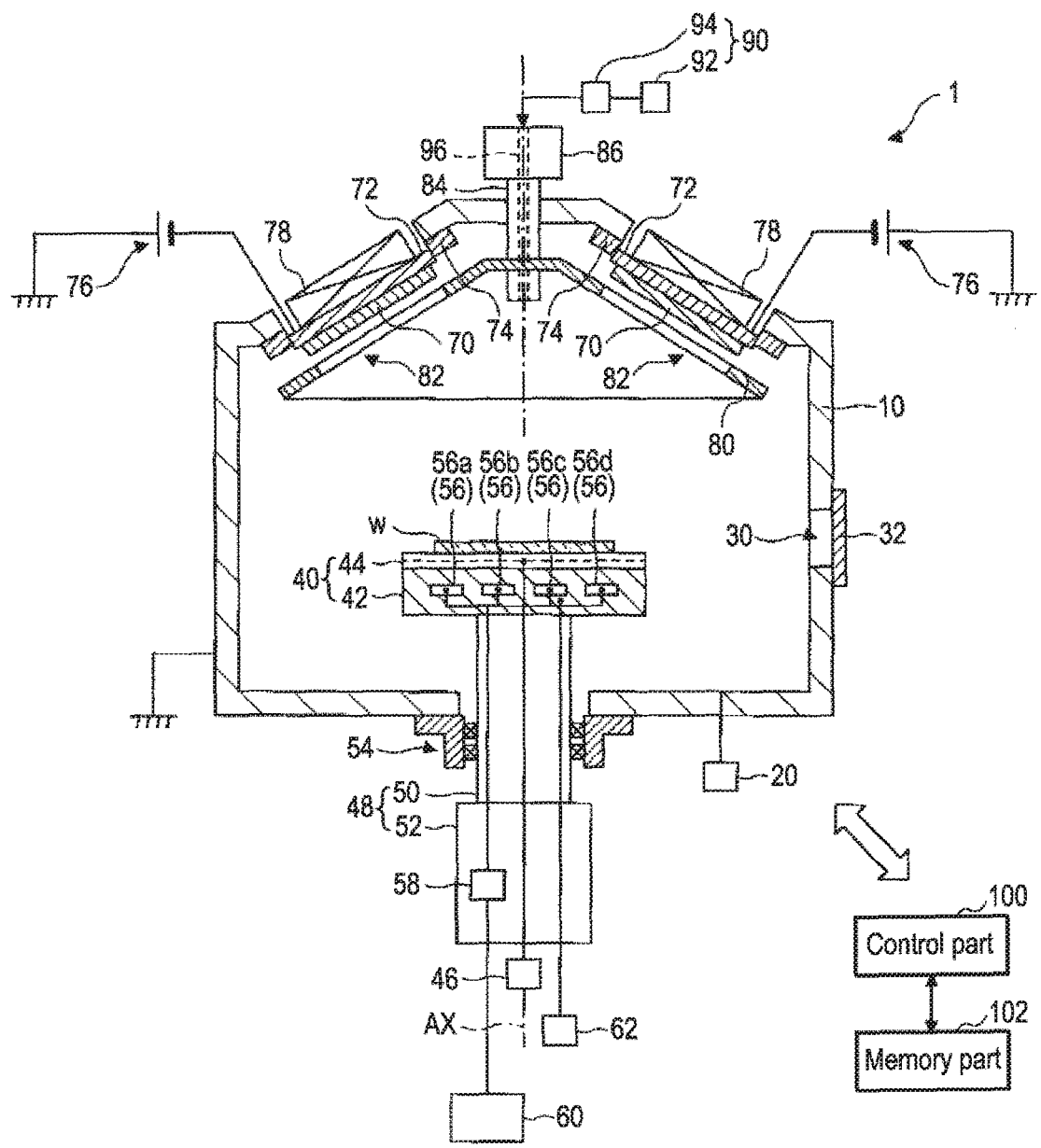
FIG. 1 is a schematic configuration diagram showing a film forming apparatus according to one embodiment.

Reference will now be made in detail to various embodiments, examples of which are illustrated in the accompanying drawings. In the specification and the drawings, the same reference numerals are given to constituent elements having substantially the same functional configuration. Redundant description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A mounting table system according to one embodiment of the present disclosure is a system applicable to a substrate processing apparatus that performs processes such as film formation, etching and the like on a substrate, for example. Hereinafter, descriptions will be made by way of example on a case where the mounting table system according to one embodiment of the present disclosure is applied to a film forming apparatus as an example of a substrate processing apparatus. However, the present disclosure is not limited thereto. The mounting table system may be applied to other substrate processing apparatuses such as an etching apparatus and the like. The mounting table system may be used alone.

(Film Forming Apparatus)

A film forming apparatus according to one embodiment of the present disclosure will be described. FIG. 1 is a schematic configuration diagram showing a film forming apparatus according to one embodiment.

As shown in FIG. 1, the film forming apparatus 1 includes a process container 10. The process container 10 is made of, for example, aluminum, and is grounded. An exhaust device 20 is connected to a bottom portion of the process container 10. The exhaust device 20 includes a vacuum pump such as a cryo-pump or a dry pump and reduces a pressure of an internal process space of the process container 10 to a predetermined degree of vacuum. A gate valve 32 that opens and closes a transfer gate 30 through which a wafer W is loaded or unloaded is installed in a sidewall of the process container 10.

A mounting table 40 on which a semiconductor wafer (hereinafter referred to as a "wafer W") is placed is installed inside the process container 10. The mounting table 40 includes a base portion 42 and an electrostatic chuck 44. The base portion 42 is made of, for example, aluminum, and has a substantially disk-like shape. The electrostatic chuck 44 is installed on an upper surface of the base portion 42 and is configured to hold the wafer W with an electrostatic attractive force. The electrostatic chuck 44 is formed by sandwiching an electrode formed of a conductive film between a pair of dielectric films. A DC power source 46 is connected to the electrode of the electrostatic chuck 44. The electrostatic chuck 44 adsorptively holds the wafer W onto the electrostatic chuck 44 by virtue of the electrostatic force as a voltage is applied from the DC power source 46.

The mounting table 40 is connected to a driving mechanism 48. The driving mechanism 48 includes a rotary shaft 50 and a driving device 52. The rotary shaft 50 is a substantially columnar member. A central axis line of the rotary shaft 50 substantially coincides with an axis line AX extending along a vertical direction. The axis line AX is an axis passing through the center of the mounting table 40 in the vertical direction. The rotary shaft 50 extends from just below the mounting table 40 to the outside of the process container 10 through the bottom portion of the process container 10. A sealing member 54 such as a magnetic fluid seal or the like is installed between the rotary shaft 50 and the bottom portion of the process container 10. The sealing member 54 seals a space defined between the bottom portion of the process container 10 and the rotary shaft 50 so that the rotary shaft 50 can rotate and move up and down.

The mounting table 40 is attached to an upper end of the rotary shaft 50. The driving device 52 is attached to a lower end of the rotary shaft 50. The driving device 52 generates power for rotating and vertically moving the rotary shaft 50. The mounting table 40 rotates around the axis line AX as the rotary shaft 50 is rotated by the power of the driving device 52. In addition, the mounting table 40 moves up and down as the rotary shaft 50 is vertically moved by the power of the driving device 52. The rotary shaft 50 may be integrally formed with the mounting table 40. The rotational speed of the mounting table 40 may be, for example, 60 rpm to 120 rpm.

A plurality of heaters 56, for example, four heaters 56a, 56b, 56c and 56d, is embedded in the base portion 42 of the mounting table 40. At least one heater 56 is installed for each region when the mounting table 40 is divided into a plurality of zones (regions). Thus, the mounting table 40 may be heated for each region. A set temperature at the time of heating the mounting table 40 may be, for example, 150 degrees C. to 400 degrees C. Alternatively, the heaters 56 may be embedded in the electrostatic chuck 44 or may be a sheet-type heater that can be attached to the mounting table 40. The number of the heaters 56 is not limited to four but may be three or less, or five or more.

Figure 2A:
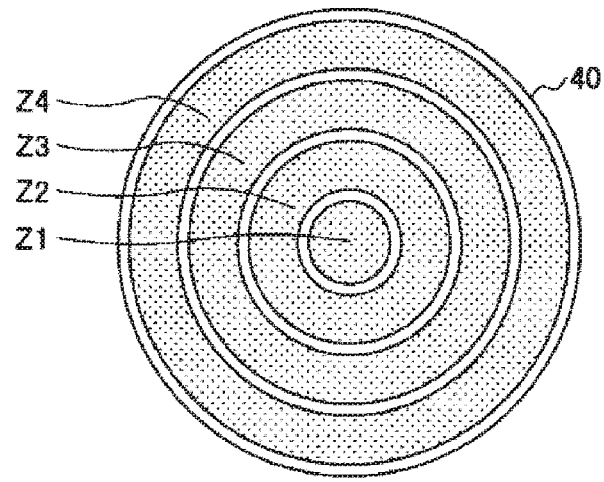
FIGS. 2A and 2B are views for explaining a plurality of regions in a mounting table according to one embodiment.
Figure 2B:
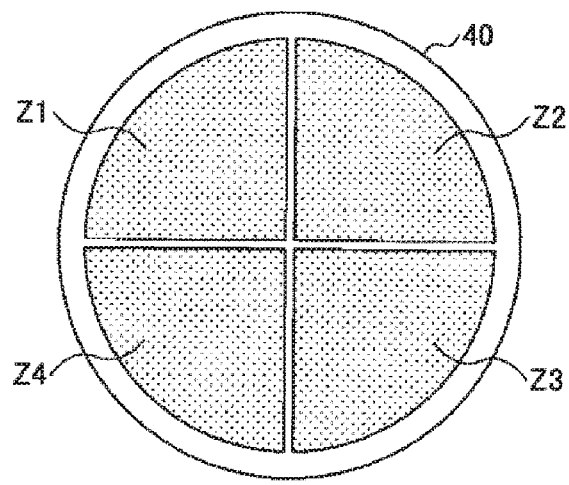

FIGS. 2A and 2B are views for explaining a plurality of regions in the mounting table 40 and are schematic diagrams of the mounting table 40 when viewed from above. In FIGS. 2A and 2B, for the sake of convenience, only a plurality of regions Z1, Z2, Z3 and Z4 is shown and the illustration of the heaters 56 is omitted.

As shown in FIG. 2A, the mounting table 40 may be concentrically divided into four regions Z1, Z2, Z3 and Z4. Each of the four regions Z1, Z2, Z3 and Z4 is formed in an annular shape. In this case, the plurality of heaters 56 is concentrically arranged in a corresponding relationship with the respective regions. Since the plurality of heaters 56 is installed concentrically, the temperature distribution in the radial direction of the mounting table 40 (wafer W) can be controlled with high accuracy.

As shown in FIG. 2B, the mounting table 40 may be divided into four regions Z1, Z2, Z3 and Z4 along the circumferential direction. Each of the four regions Z1, Z2, Z3 and Z4 is formed in a fan shape in this case, the plurality of heaters 56 is arranged along the circumferential direction in a corresponding relationship with the spective regions. Since plurality of heaters 56 is installed along the circumferential direction, it is possible to control the circumferential temperature distribution of the mounting table 40 (wafer W) with high accuracy.

The mounting table 40 may be divided in other shapes as long as it is divided into a plurality of regions.

Referring again to FIG. 1, an AC power source 60 is connected to the plurality of heaters 56 via a slip ring 58. By supplying the electric power from the AC power source 60 to the heaters 56 via the slip ring 58, it is possible to adjust the temperature of the mounting table 40 (wafer W) to a predetermined temperature. Depending on a rotational angle of the mounting table 40, the slip ring 58 switches the supply of the AC power from the AC power source 60 to one of the heaters 56 from another of the heaters 56. The configuration of the slip ring 58 will be described later.

The film forming apparatus 1 may be installed with a temperature sensor 62 such as a thermocouple or the like for detecting the temperature of the mounting table 40. A temperature measurement portion of the temperature sensor 62 is mounted, for example, inside the base portion 42 of the mounting table 40.

One or more targets 70 are installed above the mounting table 40. The targets 70 are made of, for example, cobalt. In one embodiment, the number of the targets 70 is four. The targets 70 are arranged along an arc whose center is the axis line AX. The number of the targets 70 is not limited to four and may be an arbitrary number of one or more.

The targets 70 are held by metal holders 72. The holders 72 are supported on the top portion of the process container 10 via insulating members 74. A power source 76 is connected to the targets 70 via the holders 72. The power source 76 applies a negative DC voltage to the targets 70. The power source 76 may be a single power source for selectively applying the voltage to the plurality of targets 70 or may be a plurality of power sources connected to the plurality of targets 70, respectively. Magnets 78 are installed outside the process container 10 so as to face the targets 70 via the respective holders 72.

A shutter 80 is installed between the mounting table 40 and the targets 70. The shutter 80 extends so as to face the surface of the targets 70. In one embodiment, the shutter 80 has a shape conforming to a conical surface whose central axis line is the axis line AX.

Openings 82 are formed in the shutter 80. A rotary shaft 84 is connected to the central portion of the shutter 80. The rotary shaft 84 is a substantially columnar member. The central axis line of the rotary shaft 84 substantially coincides with the axis line AX. A lower end of the rotary shaft 84 is connected to the central portion of the shutter 80 inside the process container 10. The rotary shaft 84 extends from the inside of the process container 10 to the outside of the process container 10 through the top portion of the process container 10. Outside the process container 10, the upper end of the rotary shaft 84 is connected to a driving device 86. The driving device 86 generates power for rotating the rotary shaft 84. The shutter 80 rotates around the axis line AX as the rotary shaft 84 is rotated around the axis line AX by the power of the driving device 86. With the rotation of the shutter 80, the relative positions of the openings 82 and the targets 70 are changed. Thus, the targets 70 are shielded from the mounting table 40 by the shutter 80, or exposed to the mounting table 40 via the openings 82 of the shutter 80.

Furthermore, the film forming apparatus 1 is provided with a gas supply part 90 for supplying a gas into the process container 10. The gas supply part 90 includes a gas supply source 92, a flow rate controller 94 such as a mass flow controller or the like, and a gas introduction part 96. The gas supply source 92 is a supply source of a gas to be excited inside the process container 10 and is a supply source of, for example, a nobble gas such as an Ar gas or the like. The gas supply source 92 is connected to the gas introduction part 96 via the flow rate controller 94. The gas introduction part 96 is a gas pipe for introducing a gas from the gas supply source 92 into the process container 10 and is installed along the axis line AX.

When a gas is supplied from the gas supply part 90 into the process container 10 and when the voltage is applied to the targets 70 by the power source 76, the gas supplied into the process container 10 is excited. In addition, magnetic fields are generated in the vicinity of the targets 70 by the magnets 78. As a result, plasma is concentrated in the vicinity of the targets 70, and positive ions in the plasma collide with the targets 70, whereby a target material is discharged from the exposed targets 70. The discharged target material is deposited on the wafer W to form a thin film.

The film forming apparatus 1 includes a control part 100 such as a computer or the like for controlling the overall operations of the film forming apparatus 1. The control part 100 controls the operations of the respective parts attached to the film forming apparatus 1, for example, the exhaust device 20, the DC power source 46, the driving mechanism 48, the AC power source 60 and the gas supply part 90. In addition, the control part 100 acquires temperature data detected by the temperature sensor 62.

The control part 100 is connected to a memory part 102 which stores a control program for causing the control part 100 to realize various processes executed by the film forming apparatus 1 and various programs for causing the respective parts of the film forming apparatus 1 to execute processes in accordance with process conditions. The various programs may be stored in a storage medium and may be stored in the memory part 102. The storage medium may be a hard disk or a semiconductor memory, or may be a portable storage medium such as a CD-ROM, a DVD, a flash memory or the like. Alternatively, the various programs may be appropriately transmitted from another apparatus or a host computer to the memory part 102 by a wire or wireless communication means.

A table indicating the relationship between power ratios of the respective heaters 56 for each temperature zone of the set temperature at which a process is performed, may be stored in the memory part 102. FIG. 3 is a table showing the relationship between the power ratios of the respective heaters for each temperature zone. For example, as shown in FIG. 3, the ratios $P_{Z1}/P_{Z1}$, $P_{Z2}/P_{Z1}$, $P_{Z3}/P_{Z1}$ and $P_{Z4}/P_{Z1}$ of the electric power supplied to the heaters 56a to 56d of the regions Z1 to Z4 with respect to the electric power $P_{Z1}$ supplied to the heater 56a of the region Z1 are stored in the table for each temperature zone. The temperature zones may be, for example, three temperature zones of high temperature, medium temperature and low temperature. For example, when the set temperature at the time of the process is within the temperature zone of high temperature, the electric powers $P_{Z2}$, $P_{Z3}$ and $P_{Z4}$ to be supplied to the heaters 56b, 56c and 56d are respectively set to 1.20 times, 0.80 times and 0.60 times of the electric power $P_{Z1}$ to be supplied to the heater 56a. The temperature zones are not limited to three but may be two or less, or four or more. In addition, a table may be stored in the memory part 102 for each kind of process to be performed on the wafer W.

(Mounting Table System)

Next, mounting table systems of a first embodiment and a second embodiment capable of controlling the temperature of the heaters in a space saving manner will be described.

First Embodiment

Figure 4:
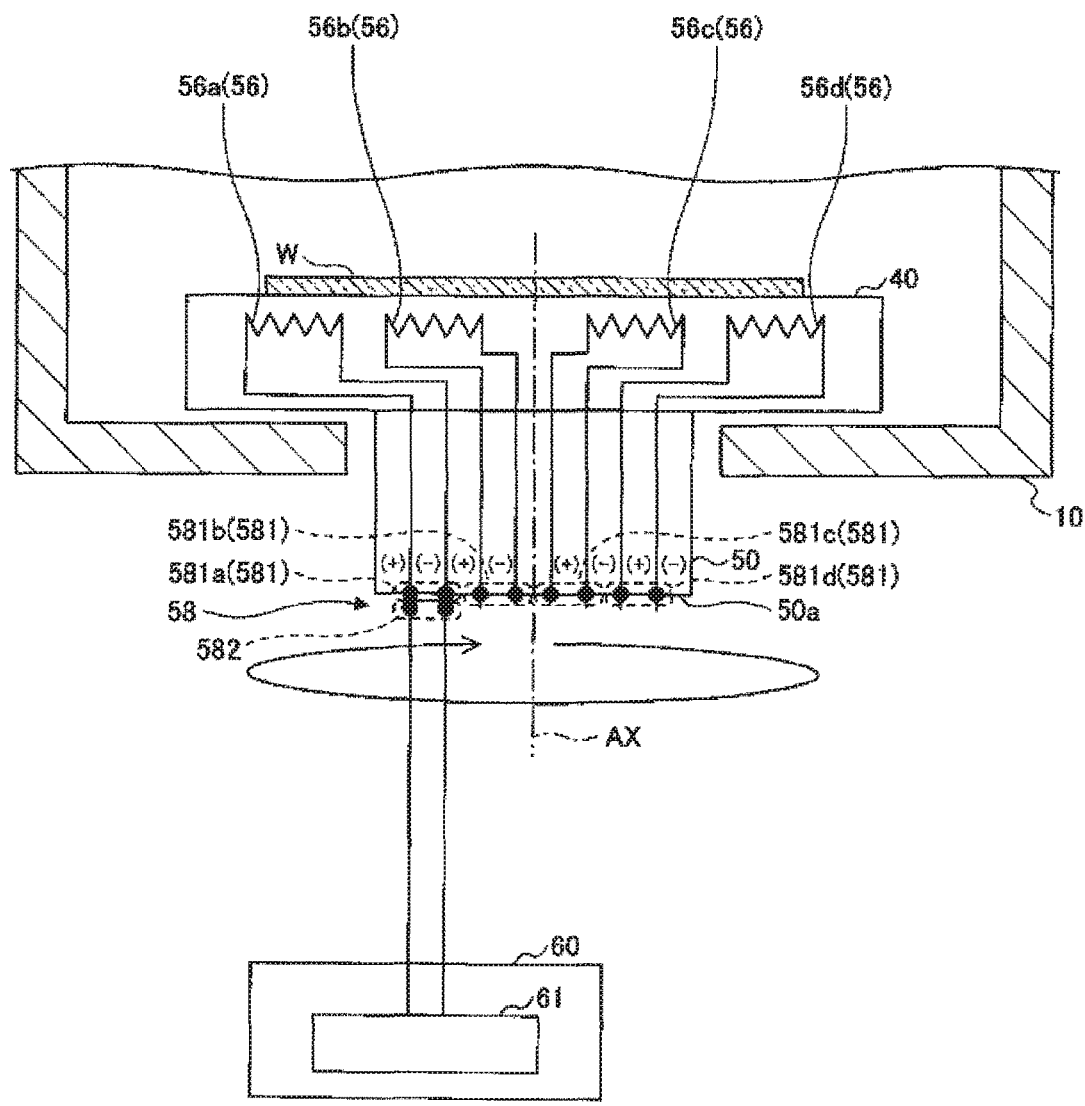
FIG. 4 is a schematic diagram of a mounting table system according to a first embodiment.
Figure 5:
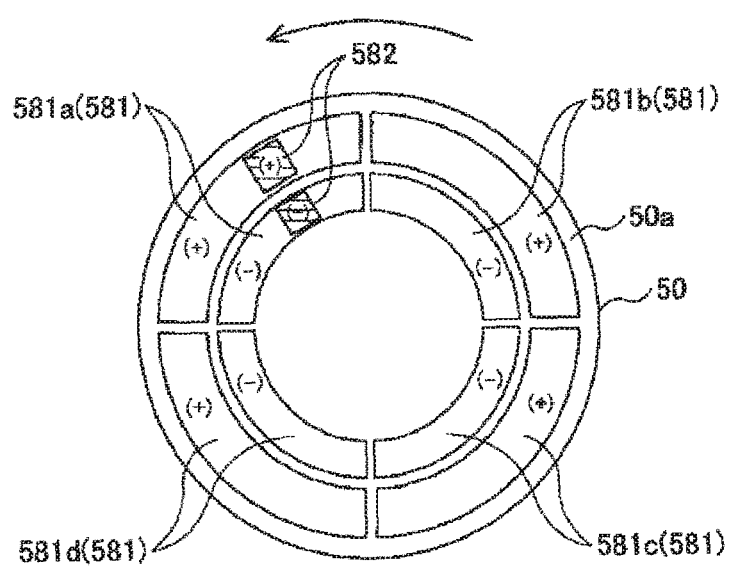
FIG. 5 is a view for explaining a slip ring of the mounting table system shown in FIG. 4.

The mounting table system of the first embodiment will be described. FIG. 4 is a schematic diagram of the mounting table system of the first embodiment. In FIG. 4, for the sake of convenience, the illustration of the driving device for rotating the mounting table is omitted. FIG. 5 is a view for explaining a slip ring of the mounting table system shown in FIG. 4 and is a schematic view available when viewed the rotary shaft from the bottom surface side.

As shown in FIG. 4, the mounting table system includes a mounting table 40, a rotary shaft 50, heaters 56, a slip ring 58, and an AC power source 60.

The mounting table 40 is rotatably installed so as to mount a wafer W thereon.

The rotary shaft 50 extends from just below the mounting table 40 to the outside of the process container 10 through the bottom portion of the process container 10. The mounting table 40 is attached to the upper end of the rotary shaft 50. The mounting table 40 rotates around the axis line AX as the rotary shaft 50 is rotated by the power of the driving device 52 shown in FIG. 1.

Each of the plurality of heaters 56 is installed inside the mounting table 40 and is configured to heat a predetermined region of the mounting table 40. Thus, it is possible to adjust the temperature of the wafer W placed on the mounting table 40.

The slip ring 58 includes a plurality of rotation-side contacts 581 and a fixed-side contact 582.

As shown in FIG. 5, the plurality of rotation-side contacts 581 is installed on a bottom surface 50a of the rotary shaft 50 at a predetermined interval along the rotation direction of the rotary shaft 50 so as to be integrally rotatable with the rotary shaft 50. The rotation-side contacts 581 include rotation-side contacts 581a, 581b, 581c and 581d. Each of the rotation-side contacts 581a, 581b, 581c and 581d includes a positive (+) terminal and a negative (−) terminal. As shown in FIG. 4, the rotation-side contacts 581a, 581b, 581c and 581d are electrically connected to the respective heaters 56a, 56b, 56c and 56d via wiring lines.

The fixed-side contact 582 is installed under the bottom surface 50a of the rotary shaft 50 so as to be able to make contact with any one of the rotation-side contacts 581 along with the rotation of the rotary shaft 50. The fixed-side contact 582 includes a positive terminal and a negative terminal installed so as to be able to make contact with the positive terminal and the negative terminal of each of the rotation-side contacts 581. In FIGS. 4 and 5, there is shown a case where the fixed-side contact 582 is in contact with the rotation-side contact 581a.

As shown in FIG. 4, the AC power source 60 is electrically connected to the fixed-side contact 582 via a wiring line. The AC power source 60 includes a thyristor 61 and supplies the electric power controlled to a predetermined value by the thyristor 61 to one of the plurality of heaters 56 via the slip ring 58. The electric power supplied from the AC power source 60 to the heater 56 is adjusted by the thyristor 61 so as to be changed at the timing when the rotation-side contact 581 making contact with the fixed-side contact 582 is switched. As a result, it is possible to supply different electric power to each heater 56. The AC power source 60 is not limited to the configuration including the thyristor 61 but may have other configurations as long as it can supply the electric power controlled to a predetermined value.

In such a mounting table system, by continuously rotating the rotary shaft 50, the fixed-side contact 582 comes into contact with any one of the rotation-side contacts 581a, 581b, 581c and 581d depending on the rotational angle of the rotary shaft 50. As a result, the predetermined electric power is supplied from the AC power source 60 to the heater 56 electrically connected to the rotation-side contact 581 making contact with the fixed-side contact 582. Specifically, by rotating the rotary shaft 50 in the direction of an arrow in FIG. 5, the fixed-side contact 582 comes into contact with the rotation-side contact 581a, the rotation-side contact 581b, the rotation-side contact 581c, and the rotation-side contact 581d in the named order. Thus, the predetermined electric power is supplied from the AC power source 60 to the heater 56a, the heater 56b, the heater 56c and the heater 56d in the named order. At this time, the electric power supplied from the AC power source 60 to the heater 56 is adjusted by the thyristor 61 so as to be changed at the timing when the rotation-side contact 581 making contact with the fixed-side contact 582 is switched. As a result, different electric power can be supplied to each heater 56 by a single AC power source 60 having a single thyristor 61. That is to say, it is possible to control the temperature of the heaters 56 in a space saving manner.

Second Embodiment

The mounting table system of the second embodiment will be described. The mounting table system of the second embodiment is different from the mounting table system of the first embodiment in that a plurality of rotation-side contacts is installed on the outer peripheral surface of the rotary shaft at a predetermined interval along the rotation direction of the rotary shaft.

Figure 6:
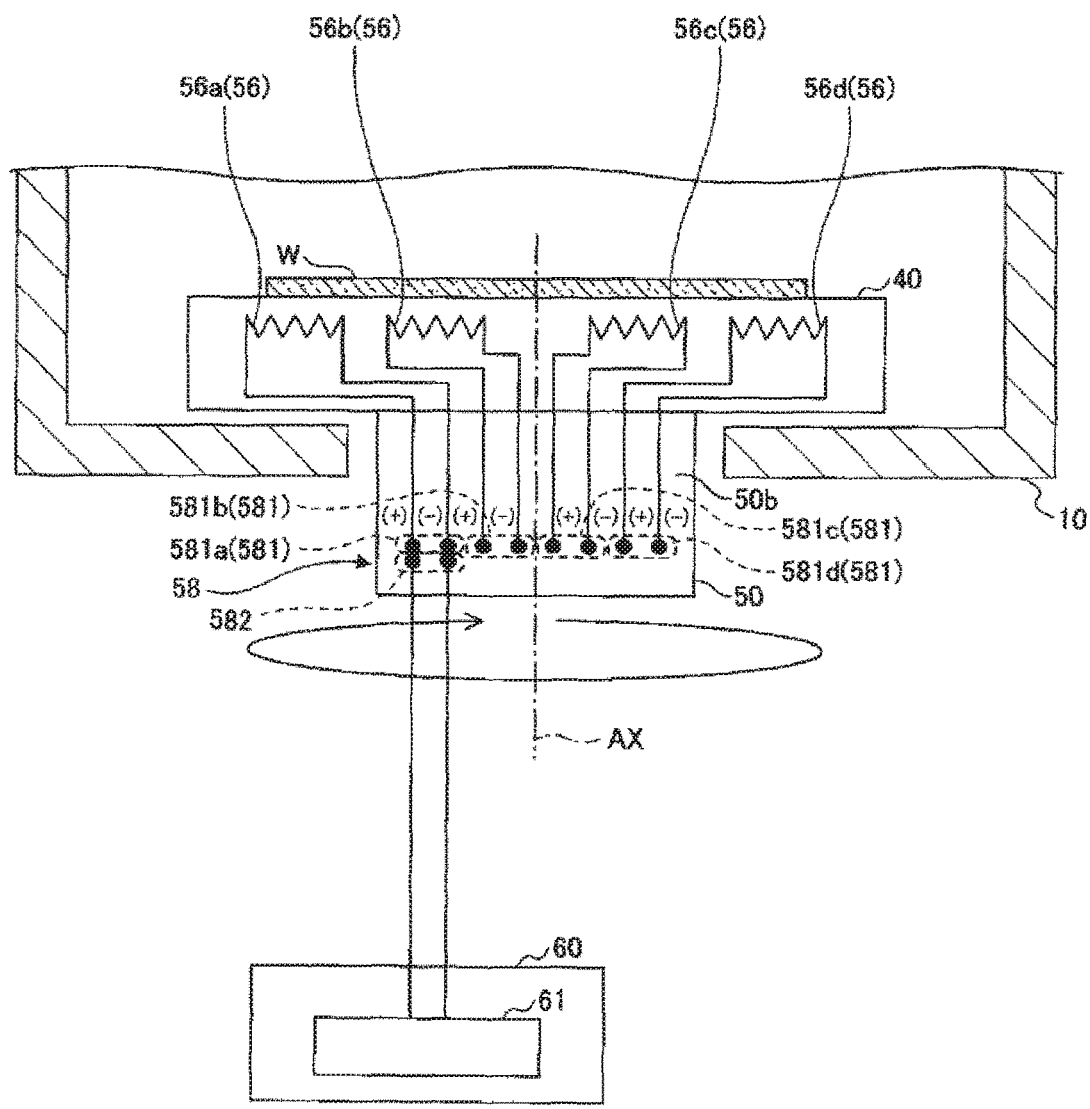
FIG. 6 is a schematic diagram of a mounting table system according to a second embodiment.
Figure 7:
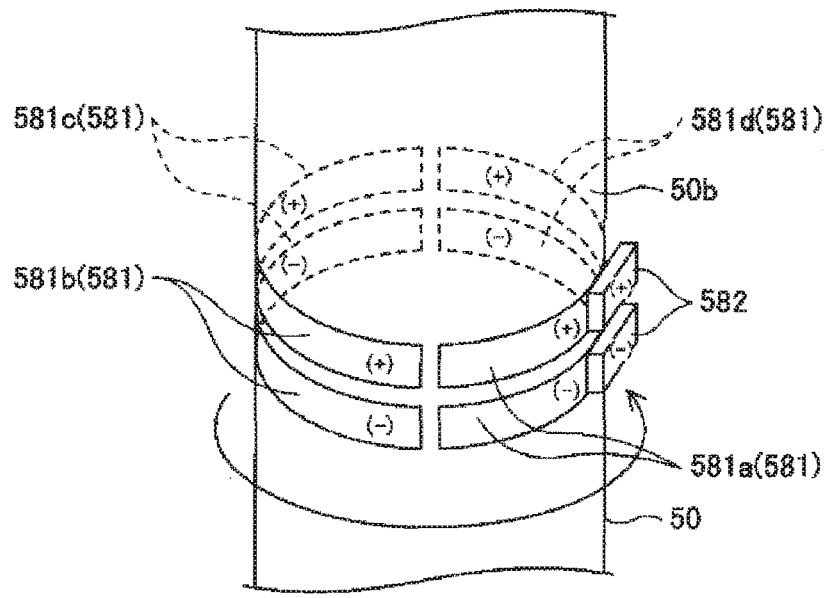
FIG. 7 is a view for explaining a slip ring of the mounting table system shown in FIG. 6.

FIG. 6 is a schematic diagram of the mounting table system of the second embodiment. In FIG. 6, for the sake of convenience, the illustration of the driving device for rotating the mounting table is omitted. FIG. 7 is a view for explaining a slip ring of the mounting table system shown in FIG. 6 and is a schematic view available when obliquely viewed the rotary shaft from above.

As shown in FIG. 6, the mounting table system includes a mounting table 40, a rotary shaft 50, heaters 56, a slip ring 58, and an AC power source 60.

The mounting table 40 is rotatably installed so as to mount a wafer W thereon.

The rotary shaft 50 extends from just below the mounting table 40 to the outside of the process container 10 through the bottom portion of the process container 10. The mounting table 40 is attached to the upper end of the rotary shaft 50. The mounting table 40 rotates around the axis line AX as the rotary shaft 50 is rotated by the power of the driving device 52 shown in FIG. 1.

Each of the plurality of heaters 56 is installed inside the mounting table 40 and is configured to heat a predetermined region of the mounting table 40. Thus, it is possible to adjust the temperature of the wafer W placed on the mounting table 40.

The slip ring 58 includes a plurality of rotation-side contacts 581 and a fixed-side contact 582.

As shown in FIG. 7, the rotation-side contacts 581 is installed on an outer peripheral surface 50b of the rotary shaft 50 at a predetermined interval along the rotation direction of the rotary shaft 50 so as to be integrally rotatable with the rotary shaft 50. The rotation-side contacts 581 include rotation-side contacts 581a, 581b, 581c and 581d. Each of the rotation-side contacts 581a, 581b, 581c and 581d includes a positive (+) terminal and a negative (−) terminal. As shown in FIG. 6, the rotation-side contacts 581a, 581b, 581c and 581d are electrically connected to the respective heaters 56a, 56b, 56c and 56d via wiring lines.

The fixed-side contact 582 is installed outside the outer peripheral surface 50b of the rotary shaft 50 so as to be able to make contact with any one of the rotation-side contacts 581 along with the rotation of the rotary shaft 50. The fixed-side contact 582 includes a positive terminal and a negative terminal installed so as to be able to make contact with the positive terminal and the negative terminal of each of the rotation-side contacts 581. In FIGS. 6 and 7, there is shown a case where the fixed-side contact 582 is in contact with the rotation-side contact 581a.

As shown in FIG. 6, the AC power source 60 is electrically connected to the fixed-side contact 582 via a wiring line. The AC power source 60 includes a thyristor 61 and supplies the electric power controlled to a predetermined value by the thyristor 61 to one of the heaters 56 via the slip ring 58. The electric power supplied from the AC power source 60 to the heater 56 is adjusted by the thyristor 61 so as to be changed at the timing when the rotation-side contact 581 making contact with the fixed-side contact 582 is switched. As a result, it is possible to supply different electric power to each heater 56. The AC power source 60 is not limited to the configuration including the thyristor 61 but may have other configurations as long as it can supply the electric power controlled to a predetermined value.

In such a mounting table system, by continuously rotating the rotary shaft 50, the fixed-side contact 582 comes into contact with any one of the rotation-side contacts 581a, 581b, 581c and 581d depending on the rotational angle of the rotary shaft 50. As a result, the predetermined electric power is supplied from the AC power source 60 to the heater 56 electrically connected to the rotation-side contact 581 making contact with the fixed-side contact 582. Specifically, by rotating the rotary shaft 50 in the direction of an arrow in FIG. 7, the fixed-side contact 582 comes into contact with the rotation-side contact 581a, the rotation-side contact 581b, the rotation-side contact 581c, and the rotation-side contact 581d in the named order. Thus, the predetermined electric power is supplied from the AC power source 60 to the heater 56a, the heater 56b, the heater 56c and the heater 56d in the named order. At this time, the electric power supplied from the AC power source 60 to the heater 56 is adjusted by the thyristor 61 so as to be changed at the timing when the rotation-side contact 581 making contact with the fixed-side contact 582 is switched. As a result, different electric power can be supplied to each heater 56 by a single AC power source 60 having a single thyristor 61. That is to say, it is possible to control the temperature of the heaters 56 in a space saving manner.

(Temperature Control Method)

Figure 8:
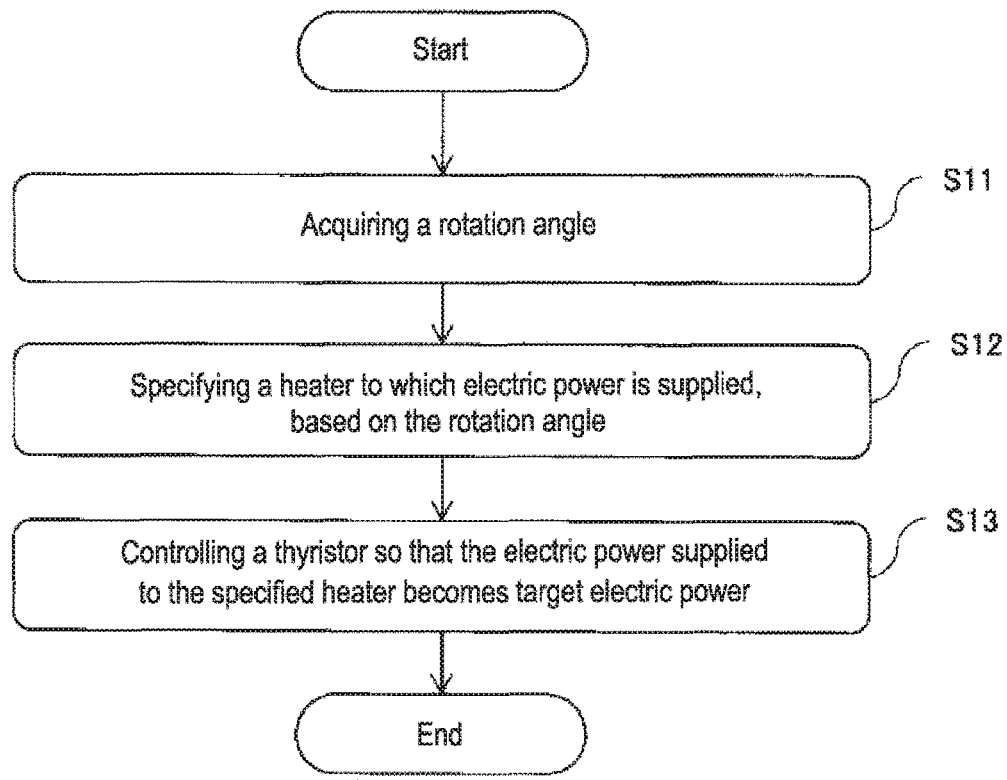
FIG. 8 is a flowchart showing a temperature control method according to one embodiment.

Next, a temperature control method according to one embodiment of the present disclosure will be described. FIG. 8 is a flowchart showing the temperature control method according to one embodiment.

First, the control part 100 acquires the rotational angle of the mounting table 40 (step S11). Specifically, the control part 100 may acquire the rotational angle from the driving device 52, or may calculate the rotational angle based on the rotational angle of the mounting table 40 available before the start of rotation of the mounting table 40, the rotational speed of the mounting table 40 and the elapsed time from the start of rotation of the mounting table 40.

Subsequently, the control part 100 specifies the heater 56 to which the electric power is to be supplied from the AC power source 60, based on the acquired rotational angle of the mounting table 40 (step S12). Specifically, for example, based on a table indicating the correspondence relationship between the rotational angle of the mounting table 40 and the heater 56 stored in advance in the memory part 102, the control part 100 specifies the heater 56 to which the electric power is to be supplied from the AC power source 60.

Subsequently, the control part 100 controls the operation of the thyristor 61 of the AC power source 60 so that the electric power to be supplied to the specified heater 56 becomes the predetermined target electric power (step S13).

Different electric power can be supplied to each heater 56 by a single AC power source 60 having a single thyristor 61 by executing the above steps (steps S11 to S13) at prede-termined time intervals. That is to say, it is possible to control the temperature of the heaters 56 in a space saving manner.

Next, an example of a method of calculating the electric power to be supplied to the heaters 56 will be described. FIG. 9 is a flowchart showing a method of calculating the electric power to be supplied to the heaters 56.

First, the control part 100 acquires the set temperature of the mounting table 40 from the memory part 102 (step S21). The set temperature of the mounting table 40 is, for example, a value determined according to the process performed on the wafer W, and is stored in the memory part 102.

Subsequently, the control part 100 acquires the relationship between the power ratios of the respective heaters 56 in the temperature zone including the set temperature acquired in step S21 (step S22). Specifically, the control part 100 acquires the power ratios of the respective heaters 56 in the temperature zone including the set temperature acquired in step S21, with reference to a table indicating the relationship between the power ratios of the respective heaters for each temperature zone.

Subsequently, the control part 100 acquires the temperature (hereinafter also referred to as a "sensor temperature") detected by the temperature sensor 62 (step S23).

Subsequently, on the basis of the set temperature acquired in steps S21 to S23, the relationship between the power ratios of the respective heaters 56 and the sensor temperature, the control part 100 calculates a target electric power to be supplied to each heater 56 so that the sensor temperature becomes the set temperature (step S24).

Thus, it is possible to calculate the electric power to be supplied to each heater 56. The method of calculating the electric power to be supplied to the heater 56 is one example. The order of steps S21 to S23 may be changed. These steps may be performed at the same time. In addition, during a certain period of time or until reaching a certain temperature, any one of these steps may be omitted.

Next, a temperature control method according to one embodiment of the present disclosure will be specifically described. Hereinafter, descriptions will be made by way of example on a case where the mounting table 40 is divided into four regions Z1, Z2, Z3 and Z4 and the heaters 56a, 56b, 56c and 56d are respectively installed in the four regions Z1, Z2, Z3 and Z4. It is assumed that the electric power is supplied to the heater 56a when the rotational angle of the mounting table 40 (the rotary shaft 50) is 0 to 90 degrees, to the heater 56b when the rotational angle of the mounting table 40 is 90 to 180 degrees, to the heater 56c when the rotational angle of the mounting table 40 is 180 to 270 degrees, and to the heater 56d when the rotational angle of the mounting table 40 is 270 to 360 degrees.

FIG. 10 is a timing chart showing the temperature control method according to one embodiment. In FIG. 10, "θ" denotes the rotational angle of the mounting table 40. "$P_{Z1}$" denotes the electric power supplied to the heater 56a disposed in the region Z1. "$P_{Z2}$" denotes the electric power supplied to the heater 56b disposed in the region Z2. "$P_{Z3}$" denotes the electric power supplied to the heater 56c disposed in the region Z3. "$P_{Z4}$" denotes the electric power supplied to the heater 56d disposed in the region Z4. Respective times are denoted by t1 to t9.

First, when the rotation of the mounting table 40 is started (time t1), the control part 100 controls the operation of the thyristor 61 so that the electric power supplied from the AC power source 60 becomes P1. As a result, the electric power P1 is supplied to the heater 56a disposed in the region Z1.

Subsequently; when the rotational angle of the mounting table 40 reaches 90 degrees (time t2), the control part 100 controls the operation of the thyristor 61 so that the electric power supplied from the AC power source 60 becomes P2. As a result, the electric power P2 is supplied to the heater 56b disposed in the region Z2.

Subsequently, when the rotational angle of the mounting table 40 reaches 180 degrees (time t3), the control part 100 controls the operation of the thyristor 61 so that the electric power supplied from the AC power source 60 becomes P3. As a result, the electric power P3 is supplied to the heater 56c disposed in the region Z3.

Subsequently, when the rotational angle of the mounting table 40 reaches 270 degrees (time t4), the control part 100 controls the operation of the thyristor 61 so that the electric power supplied from the AC power source 60 becomes P4. As a result, the electric power P4 is supplied to the heater 56d disposed in the region Z4.

As described above, it is possible to supply different powers to the four heaters 56a, 56b, 56c and 56d while the mounting table 40 rotates once. Thereafter, by repeating the same control as from time t1 to time t4, it is possible to independently control the powers supplied to the four heaters 56a, 56b, 56c and 56d.

As described above, the control part 100 adjusts the electric power supplied from the AC power source 60 in synchronization with the timing at which the heater 56 supplied with the electric power is switched, which makes it possible to supply different electric power to each heater 56 by a single AC power source 60 having a single thyristor 61. That is to say, it is possible to control the temperature of the heaters 56 in a space saving manner. In addition, since the temperature control of the heaters 56 can be realized with a small number of parts, it is possible to perform temperature control which suppresses the defect rate and the increase in cost. If it is unnecessary to change the electric power for each region, for example, the electric power P1 may be supplied to the four heaters 56a, 56b, 56c and 56d.

In the embodiments described above, the wafer W is one example of a substrate. The heaters 56 are one example of heating parts. The slip ring 58 is one example of a power switching part. The temperature sensor 62 is one example of a temperature detecting part.

According to the present disclosure in some embodiments, it is possible to perform temperature control of a plurality of heating parts in a space saving manner.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A mounting table system, comprising:
a mounting table rotatably installed so as to mount a substrate thereon;
a plurality of heating parts installed in the mounting table, and configured to heat the mounting table, the plurality of heating parts including a first heating part and a second heating part;
a single power source configured to supply an electric power switchably to one of the plurality of heating parts; and
a power switching part configured to switch the supply of the electric power to the one of the plurality of heating parts such that the electric power is supplied to the first heating part when a rotational angle of the mounting table is in a first angle range and the electric power is supplied to the second heating part when the rotational angle of the mounting table is in a second angle range, the rotational angle of the mounting table being calculated from starting rotation of the mounting table,
wherein the mounting table is supported on a rotary shaft installed in a rotatable manner, and
wherein the power switching part is installed so as to be integrally rotatable with the rotary shaft, the power switching part including a plurality of rotation-side contacts electrically connected to each of the plurality of heating parts and a fixed-side contact installed so as to contact one of the plurality of rotation-side contacts in response to a rotation of the rotary shaft.

2. The system of claim 1, wherein the plurality of rotation-side contacts is installed on a bottom surface of the rotary shaft at a predetermined interval along a rotation direction of the rotary shaft.

3. The system of claim 1, wherein the plurality of rotation-side contacts is installed on an outer peripheral surface of the rotary shaft at a predetermined interval along a rotation direction of the rotary shaft.

4. The system of claim 1, wherein the plurality of heating parts is installed concentrically.

5. The system of claim 1, wherein the plurality of heating parts is installed along a circumferential direction of the mounting table.

6. A substrate processing apparatus, comprising:
the mounting table system of claim 1; and
a control part configured to control the electric power supplied to each of the plurality of heating parts,
wherein the mounting table system further includes a temperature detecting part configured to detect a temperature of the mounting table, and
the control part is configured to control the electric power supplied to each of the plurality of heating parts based on a temperature detected by the temperature detecting part and a set temperature.

7. The apparatus of claim 6, wherein the control part refers to a memory part which stores ratios of the electric power supplied to each of the plurality of heating parts in association with predetermined temperature zones, and controls the electric power supplied to each of the plurality of heating parts based on the temperature detected by the temperature detecting part installed in a region where at least one of the plurality of heating parts is disposed and the set temperature.

8. The system of claim 1, the first angle range is from 0 to 90 degrees.

9. The system of claim 1, the second angle range is from 90 to 180 degrees.

10. A temperature control method which makes use of a mounting table system including:
a mounting table rotatably installed so as to mount a substrate thereon; a plurality of heating parts installed in the mounting table and configured to heat the mounting table, the plurality of heating parts including a first heating part and a second heating part;

a single power source configured to supply an electric power switchably to one of the plurality of heating parts; and a power switching part configured to switch the one of the plurality of heating parts, the method comprising:

controlling the power switching part to switch the one of the plurality of heating parts such that the electric power is supplied to the first heating part when a rotational angle of the mounting table is in a first angle range and the electric power is supplied to the second heating part when the rotational angle of the mounting table is in a second angle range, the rotational angle of the mounting table being calculated from a starting rotation of the mounting table; and controlling the electric power supplied to the plurality of heating parts in synchronization with a timing at which the plurality of heating parts supplied with the electric power from the single power source is switched, wherein the mounting table is supported on a rotary shaft installed in a rotatable manner, and wherein the power switching part is installed so as to be integrally rotatable with the rotary shaft, the power switching part including a plurality of rotation-side contacts electrically connected to each of the plurality of heating parts and a fixed-side contact installed so as to make contact with one of the plurality of rotation-side contacts in response to a rotation of the rotary shaft.

11. The method of claim 10, the first angle range is from 0 to 90 degrees.

12. The method of claim 10, the second angle range is from 90 to 180 degrees.

13. A mounting table system, comprising:

a mounting table rotatably installed so as to mount a substrate thereon;

a plurality of heating parts installed in the mounting table and configured to heat the mounting table, the plurality of heating parts including a first heating part and a second heating part; and a power switching part configured to be switched to supply an electric power to one of the plurality of heating parts such that the electric power is supplied to the first heating part when a rotational angle of the mounting table is in a first angle range, and the electric power is supplied to the second heating part when the rotational angle of the mounting table is in a second angle range, the rotational angle of the mounting table being calculated from starting rotation of the mounting table, wherein the mounting table is supported on a rotary shaft installed in a rotatable manner, and wherein the power switching part is installed so as to be integrally rotatable with the rotary shaft, the power switching part including a plurality of rotation-side contacts electrically connected to each of the plurality of heating parts and a fixed-side contact installed so as to make contact with one of the plurality of rotation-side contacts in response to a rotation of the rotary shaft.

14. The system of claim 13, the first angle range is from 0 to 90 degrees.

15. The system of claim 13, the second angle range is from 90 to 180 degrees.

* * * * *